United States Patent
Zheng et al.

(10) Patent No.: US 9,140,744 B2
(45) Date of Patent: Sep. 22, 2015

(54) DOUBLY-FED INDUCTION GENERATOR SYSTEM AND THE SELF-TEST METHOD FOR THE ACTIVE CROWBAR CIRCUIT THEREOF

(75) Inventors: Jianfei Zheng, Shanghai (CN); Fei Lu, Shanghai (CN); Zhi Li, Shanghai (CN); Aibin Qiu, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 361 days.

(21) Appl. No.: 13/472,221

(22) Filed: May 15, 2012

(65) Prior Publication Data
US 2013/0027003 A1    Jan. 31, 2013

(30) Foreign Application Priority Data
Jul. 29, 2011   (CN) .......................... 2011 1 0214889

(51) Int. Cl.
*F03D 9/00* (2006.01)
*G01R 31/28* (2006.01)
*G01R 31/34* (2006.01)

(52) U.S. Cl.
CPC .......... *G01R 31/2827* (2013.01); *G01R 31/343* (2013.01)

(58) Field of Classification Search
CPC .. G01R 31/343; G01R 31/2827; F03D 7/045; F03D 1/003; Y02E 10/70; Y02E 10/763
USPC ...................... 290/44, 55; 700/286, 287, 288
See application file for complete search history.

(56) References Cited

U.S. PATENT DOCUMENTS

| | | | |
|---|---|---|---|
| 7,622,815 B2 | 11/2009 | Rivas et al. | |
| 2004/0026929 A1* | 2/2004 | Rebsdorf et al. | ................ 290/44 |
| 2006/0290316 A1* | 12/2006 | Seguchi et al. | ............... 318/720 |
| 2007/0052244 A1* | 3/2007 | Hudson | ........................... 290/44 |

FOREIGN PATENT DOCUMENTS

| | | |
|---|---|---|
| CN | 101630850 | 1/2010 |
| CN | 101931240 | 12/2010 |
| EP | 1499009 | 1/2005 |
| EP | 2043254 | 4/2009 |
| TW | 201031817 | 9/2010 |

* cited by examiner

*Primary Examiner* — Julio C. Gonzalez
(74) *Attorney, Agent, or Firm* — Kirton McConkie; Evan R. Witt

(57) ABSTRACT

Provided is a doubly-fed induction generator system and a self-test method for the active crowbar circuit of the doubly-fed induction generator system. The invention is featured by using the controller of the doubly-fed induction generator system to carry out a self-test procedure to detect the loop current of the active crowbar circuit for determining if the active crowbar circuit can be turned on and off normally. Also, the rotor-side converter and the active crowbar circuit of the doubly-fed induction generator system are forbidden to turn on simultaneously during the execution of the self-test procedure.

7 Claims, 4 Drawing Sheets

DOUBLY-FED INDUCTION GENERATOR SYSTEM AND THE SELF-TEST METHOD FOR THE ACTIVE CROWBAR CIRCUIT THEREOF

FIELD OF THE INVENTION

The invention relates to a doubly-fed induction generator system, and more particularly to a doubly-fed induction generator system having an active crowbar circuit for implementing the function of low-voltage ride-through (LVRT).

BACKGROUND OF THE INVENTION

The contemporary wind turbine principally employs a doubly-fed induction generator (DFIG) as the major wind generator. When the power grid is abnormal and the voltage of point of common connection (PCC) is sagged, the doubly-fed induction generator has to keep connected to the grid until the grid returns to the normal state, thereby riding through this low-voltage period (zone). Therefore, the doubly-fed induction generator generally is required to have the function of low-voltage ride-through (LVRT). Nowadays, the most common LVRT technique applied to the doubly-fed induction generator is active crowbar circuit. The active crowbar circuit is used to protect the rotor-side circuitry of the doubly-fed induction generator by shorting it and absorbing the inrush current flowing in the rotor-side circuitry of the DFIG when the voltage of the grid is sagged and a transient over-voltage condition and over-current condition are occurred to the rotor-side circuitry of the DFIG accordingly.

The conventional active crowbar circuit is connected in parallel with the rotor of the doubly-fed induction generator, and includes a rectifier bridge and an IGBT (insulated-gate bipolar transistor) switch as well as a resistor for absorbing the inrush current. Each rectifier arm of the rectifier bridge is consisted of two serially-connected diodes, and the IGBT switch and the absorption resistor are placed on the DC side of the active crowbar circuit. In addition, in order to ensure that the active crowbar circuit can turn on and off normally, the active crowbar circuit has to carry out a self-test procedure after the doubly-fed induction generator is powered on for detecting if the active crowbar circuit can operate normally. The conventional self-test method for active crowbar circuit includes the following types. The first type of the self-test method is to detect if the voltage of the rectifier bridge of the active crowbar circuit is zero. However, the disadvantage of such type of self-test method is that the voltage across the bridge arm is uncertain due to the parasite capacitors when the IGBT switch of the active crowbar circuit is turned off. Therefore, the threshold voltage for testing if the IGBT switch is turned on is difficult to design, and a voltage sensor is needed for voltage detection. The second type of self-test method is to detect the current of the active crowbar circuit to determine if the IGBT switch of the active crowbar circuit is turned on. However, such type of self-test method also has some disadvantages. This is because the resistance of the active crowbar circuit is generally very small, e.g. smaller than 1Ω. If the rotor-side converter and the IGBT switch of the active crowbar circuit are turned on simultaneously by the PWM signal, it will cause the over-current problem to the rotor-side converter.

Hence, the applicants endeavor to develop a doubly-fed induction generator system and a self-test method for the active crowbar circuit thereof. With the invention, the active crowbar circuit of the doubly-fed induction generator system can be self-tested without causing the over-current problem to the rotor-side converter of the doubly-fed induction generator.

SUMMARY OF THE INVENTION

A primary object of the invention is to provide a doubly-fed induction generator system, and a self-test method for the active crowbar circuit of the doubly-fed induction generator system. The self-test method allows the active crowbar circuit of the doubly-fed induction generator system to self-test itself without causing the over-current problem to the rotor-side converter of the doubly-fed induction generator system.

According to a primary aspect of the invention, a self-test method for an active crowbar circuit is provided. The active crowbar circuit is applied to a doubly-fed induction generator system which includes a rotor and a rotor-side converter. The method includes the steps of: (I) driving the rotor-side converter to turn on to allow the rotor-side converter to control the current of the rotor so as to maintain the root-mean-square value of the current of the rotor at a predetermined minimum value; (II) driving the rotor-side converter to turn off and driving the active crowbar circuit to turn on; (III) determining if the active crowbar circuit can be turned on normally; (IV) driving the active crowbar circuit to turn off; and (V) determining if the active crowbar circuit can be turned off normally.

According to a secondary aspect of the invention, a doubly-fed induction generator system is provided. The inventive doubly-fed induction generator system includes a rotor; a rotor-side converter connected to the rotor for providing an AC voltage to drive the rotor to produce a torque; an active crowbar circuit connected in parallel with the rotor for protecting the rotor and the rotor-side converter from over-voltage and over-current conditions; and a controller connected to the rotor-side converter and the active crowbar circuit for carrying out a self-test procedure to the active crowbar circuit for determining if the active crowbar circuit can be turned on and off normally. The self-test procedure is executed to detect the loop current of the active crowbar circuit for determining if the active crowbar circuit can be turned on and off normally, and the rotor-side converter and the active crowbar circuit are forbidden to turn on simultaneously during the execution of the self-test procedure.

Now the foregoing and other features and advantages of the invention will be best understood through the following descriptions with reference to the accompanying drawings, in which:

BRIEF DESCRIPTION OF THE DRAWINGS

FIG. 3 shows the equivalent circuit of the rotor of the doubly-fed induction generator system when the active crowbar circuit is turned on.

DESCRIPTION OF THE PREFERRED EMBODIMENT

An exemplary embodiment embodying the features and advantages of the invention will be expounded in following paragraphs of descriptions. It is to be realized that the present invention is allowed to have various modification in different respects, all of which are without departing from the scope of the present invention, and the description herein and the drawings are to be taken as illustrative in nature, but not to be taken as a confinement for the invention.

Figure 1:
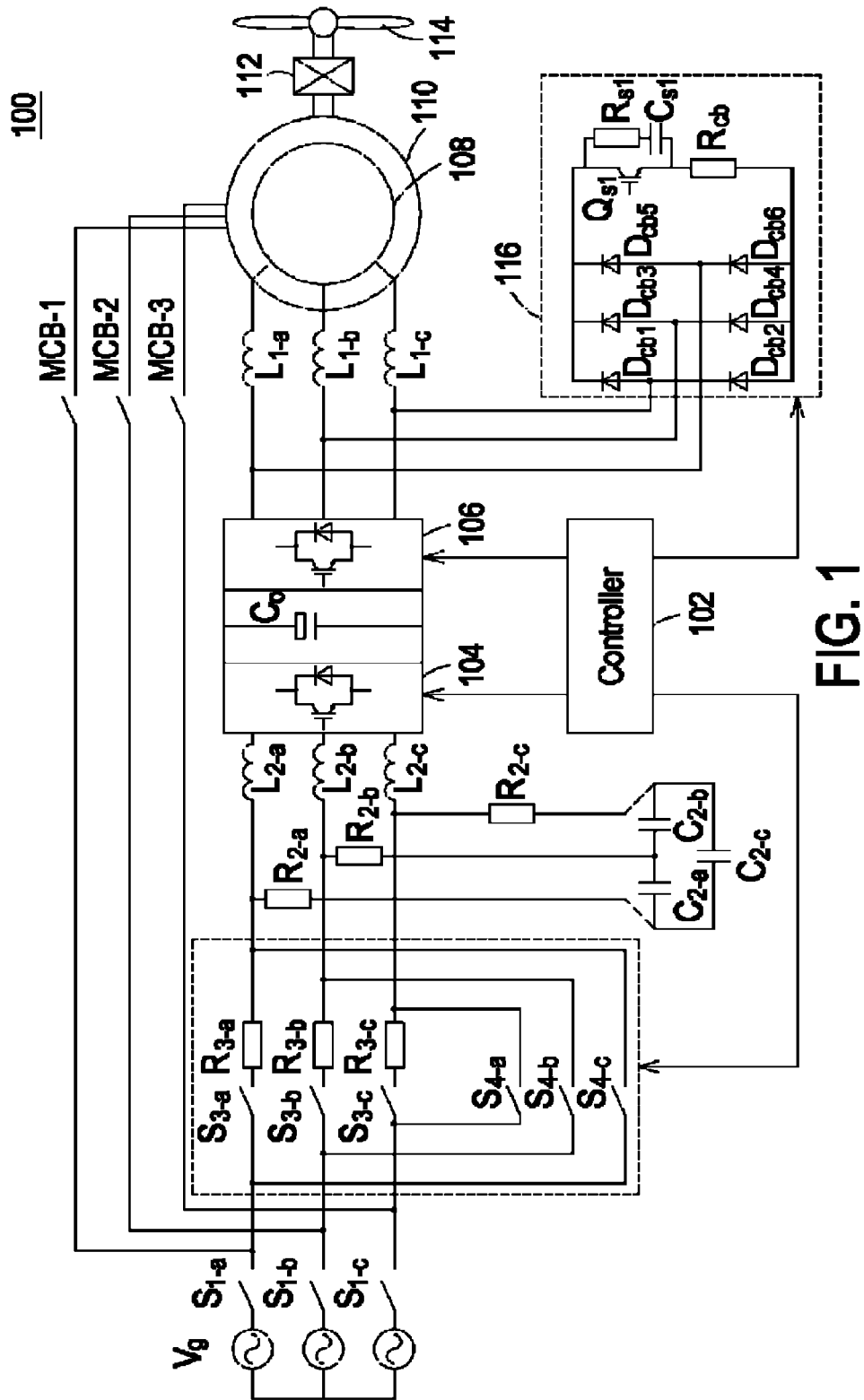
FIG. 1 shows a circuit block diagram of the doubly-fed induction generator system according to the invention.

FIG. 1 is a circuit block diagram showing the doubly-fed induction generator system according to the invention. As shown in FIG. 1, the inventive doubly-fed induction generator system 100 includes a grid $V_g$ for providing a three-phase AC voltage. The inventive doubly-fed induction generator system 100 further includes a soft-start circuit connected to the grid $V_g$ through a three-phase switch ($S_{1-a}$, $S_{1-b}$, $S_{1-c}$). The soft-start circuit includes switches $S_{3-a}$, $S_{3-b}$, $S_{3-c}$, switches $S_{4-a}$, $S_{4-b}$, $S_{4-c}$, and resistors $R_{3-a}$, $R_{3-b}$, $R_{3-c}$. The soft-start circuit is used to limit the inrush current of the doubly-fed induction generator system 100 when the doubly-fed induction generator system 100 is powered on, thereby protecting the circuit elements of the doubly-fed induction generator system 100 from being impaired due to the surging current. The resistors $R_{3-a}$, $R_{3-b}$, $R_{3-c}$ are connected in series with the switches $S_{3-a}$, $S_{3-b}$, $S_{3-c}$, and switches $S_{4-a}$, $S_{4-b}$, $S_{4-c}$ are connected in parallel with the switches $S_{3-a}$, $S_{3-b}$, $S_{3-c}$. The soft-start circuit is driven by a controller 102 to turn on the switches $S_{3-a}$, $S_{3-b}$, $S_{3-c}$ and allow the three-phase AC voltage of the grid $V_g$ to pass through the switches $S_{3-a}$, $S_{3-b}$, $S_{3-c}$ and the resistors $R_{3-a}$, $R_{3-b}$, $R_{3-c}$ when the doubly-fed induction generator system 100 is soft-started, and turn on the switches $S_{4-a}$, $S_{4-b}$, $S_{4-c}$ and turn off the switches $S_{3-a}$, $S_{3-b}$, $S_{3-c}$ and allow the three-phase AC voltage of the grid $V_g$ to pass through the switches $S_{4-a}$, $S_{4-b}$, $S_{4-c}$ after the doubly-fed induction generator system 100 has been soft-started. The doubly-fed induction generator system 100 further includes a LC filter consisted of inductors $L_{2-a}$, $L_{2-b}$, $L_{2-c}$, resistors $R_{2-a}$, $R_{2-b}$, $R_{2-c}$, and capacitors $C_{2-a}$, $C_{2-b}$, $C_{2-c}$. The inductors $L_{2-a}$, $L_{2-b}$, $L_{2-c}$ are connected in series with the resistors $R_{3-a}$, $R_{3-b}$, $R_{3-c}$, and the resistors $R_{2-a}$, $R_{2-b}$, $R_{2-c}$ are connected in series with the inductors $L_{2-a}$, $L_{2-b}$, $L_{2-c}$. The capacitor $C_{2-a}$ is connected between the resistor $R_{2-a}$ and the resistor $R_{2-b}$, and the capacitor $C_{2-b}$ is connected between the resistor $R_{2-b}$ and the resistor $R_{2-c}$. The capacitor $C_{2-c}$ is connected between the capacitor $C_{2-a}$ and the capacitor $C_{2-b}$. The LC filter is used to remove the noise of the three-phase current flowing through the inductors $L_{2-a}$, $L_{2-b}$, $L_{2-c}$, thereby smoothing the three-phase AC current flowing into the grid $V_g$ into a sinusoidal wave.

The doubly-fed induction generator system 100 further includes a set of back-to-back voltage converters, which includes a grid-side converter 104 and a rotor-side converter 106 connected with each other in a back-to-back configuration. The set of back-to-back voltage converters is connected to the inductors $L_{2-a}$, $L_{2-b}$, $L_{2-c}$, in which grid-side converter 104 is a rectifier and the rotor-side converter 106 is an inverter. The grid-side converter 104 is used to rectify the three-phase AC voltage of the grid $V_g$ into a DC link voltage, and the rotor-side converter 106 is used to convert the DC link voltage outputted by the grid-side converter 104 into an AC voltage. A DC-link capacitor $C_o$ is placed between the grid-side converter 104 and the rotor-side converter 106 as an energy storage means for maintaining the voltage ripple of the DC link voltage at a minimum value.

The doubly-fed induction generator system 100 further includes du/dt filters $L_{1-a}$, $L_{1-b}$, $L_{1-c}$ connected to the rotor-side converter 106 for suppressing the du/dt value of the AC voltage outputted by the rotor-side converter 106. The doubly-fed induction generator system 100 further includes a rotor 108 and a stator 110. The rotor 108 is connected to the set of back-to-back converters (104, 106, $C_o$) and is driven by the AC voltage outputted by the rotor-side converter 106 so as to establish a magnetic field. Thus, a torque is produced. The stator 110 is connected to the grid $V_g$ through the power-outputting switches MCB-1, MCB-2, MCB3 for transmitting the electric energy generated therefrom to the grid $V_g$ through the power-outputting switches MCB-1, MCB-2, MCB3. The doubly-fed induction generator system 100 further includes a gear box 112 and a blade 114, in which the rotor 108 is connected to the blade 114 through the gear box 112. The wind passing through the blade 114 and the gear box 112 is used to drive the doubly-fed induction generator system 100 to spin. The rotor-side converter 106 is used to control the rotor current, and the grid-side converter 104 is used to control the DC link voltage. The doubly-fed induction generator system 100 further includes an active crowbar circuit 116 connected in parallel with the rotor 108 of the doubly-fed induction generator system 100. The active crowbar circuit 116 includes a rectifier bridge consisted of diodes $D_{cb1}$-$D_{cb6}$ and an IGBT switch $Q_{s1}$ as well as an absorption resistor $R_{cb}$. The rectifier bridge is made up of three bridge arms, each of which is made up of two serially-connected diodes. The IGBT switch $Q_{s1}$ and the absorption resistor $R_{cb}$ are placed at the DC side of the active crowbar circuit 116. The active crowbar circuit 116 further includes a resistor $R_{s1}$ and a capacitor $C_{s1}$ which are connected in series with each other and connected across the two current terminals of the IGBT switch $Q_{s1}$. The resistor $R_{s1}$ and the capacitor $C_{s1}$ are used as a snubber circuit to prevent the IGBT switch $Q_{s1}$ from inducing an excessive voltage at the instant of turn-off and impairing the IGBT switch $Q_{s1}$.

The doubly-fed induction generator system 100 further includes a controller 102 connected to the soft-start circuit ($S_{3-a}$, $S_{3-b}$, $S_{3-c}$, $S_{4-a}$, $S_{4-b}$, $S_{4-c}$, $R_{3-a}$, $R_{3-b}$, $R_{3-c}$)9 the grid-side converter 104, the rotor-side converter 106, and the active crowbar circuit 116. The controller 102 is used to control the switching operations of the soft-start circuit ($S_{3-a}$, $S_{3-b}$, $S_{3-c}$, $S_{4-a}$, $S_{4-b}$, $S_{4-c}$, $R_{3-a}$, $R_{3-b}$, $R_{3-c}$), the grid-side converter 104, the rotor-side converter 106, and the IGBT switch $Q_{s1}$ of the active crowbar circuit 116. The controller 102 can carry out the self-test procedure to the active crowbar circuit 116 to determine if the active crowbar circuit 116 can operate normally.

Figure 2:
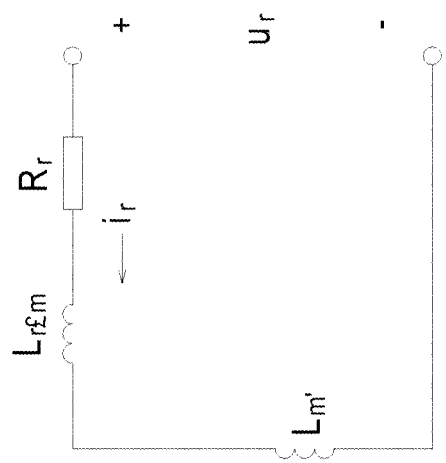
FIG. 2 shows the equivalent circuit of the rotor of the doubly-fed induction generator system after the doubly-fed induction generator system is soft-started and before the doubly-fed induction generator system is outputting power to the grid.
Figure 3:
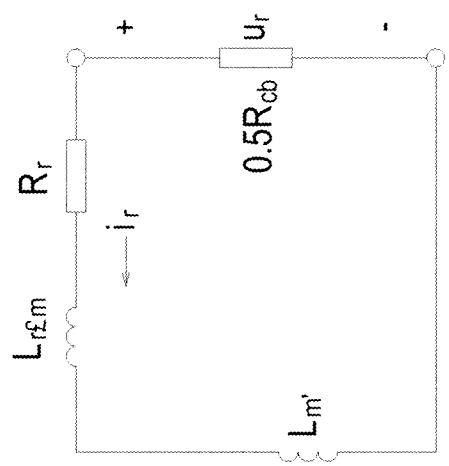
Figure 4:
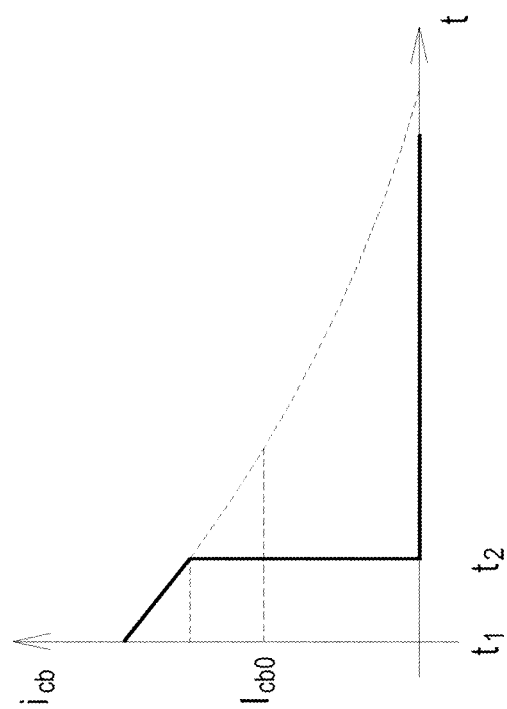
FIG. 4 shows the relationship between the loop current of the active crowbar circuit and the time.

FIG. 2 shows the equivalent circuit of the rotor of the doubly-fed induction generator system after the doubly-fed induction generator system is soft-started and before the doubly-fed induction generator system is outputting power to the grid. FIG. 3 shows the equivalent circuit of the rotor of the doubly-fed induction generator system when the active crowbar circuit is turned on. FIG. 4 shows the relationship between the loop current of the active crowbar circuit and the time. In FIGS. 2 and 3, the inductor $L_m$ is the magnetizing inductance of the rotor 108. The inductor $L_{ro}$ is the leakage inductance of the rotor 108. The resistor $R_r$ is the equivalent resistance of the rotor 108. The voltage $u_r$ is one of the phase voltages of the three-phase voltage outputted by the rotor-side converter 106. The current $i_r$ is one of the phase currents of the rotor current of the doubly-fed induction generator system 100. The current $i_{cb}$ is the loop current flowing in the DC side of the active crowbar circuit 116. The resistor $0.5R_{cb}$ is the equivalence resistance of the absorption resistor $R_{cb}$ in one phase of the three phase circuit. It is noteworthy that the equivalent circuit of FIG. 3 also includes one of the du/dt filters ($L_{1-a}$, $L_{1-b}$, $L_{1-c}$). However, as the inductance of the du/dt filters are very low and thus ignorable, the du/dt filter is not shown in FIG. 3. As to the self-test procedure carry out by the controller 102 for self-testing the active crowbar circuit 116, it will be explained in detail with reference to FIGS. 1-4.

When the doubly-fed induction generator system 100 is powered on, the controller 102 drives the grid-side converter 104 to start first so as to establish the DC link voltage (DC bus voltage) on the DC link capacitor $C_o$. Next, the controller 102 turns on the rotor-side converter 106 before the doubly-fed induction generator system 100 is outputting power to the grid $V_g$, so that the rotor-side converter 106 can control the rotor current $i_r$ and thus maintain the rms (root-mean-square) value of the rotor current $i_r$ at a predetermined minimum value, as shown in FIG. 2. Under this condition, the voltage of the stator 110 will not exceed the voltage of the grid $V_g$. Next, at the time point $t_1$, the controller 102 drives the rotor-side converter 106 to turn off and drives the IGBT switch $Q_{s1}$ of the active crowbar circuit 116 to turn on. In the meantime, if the IGBT switch $Q_{s1}$ is operating normally, it can be detected that the rotor current is flowing into the active crowbar circuit 116, as shown in FIG. 3. In the meantime, the loop current $i_{cb}$ flowing in the DC side of the active crowbar circuit 116 will be decayed exponentially as indicated by the dotted line of FIG. 4. If it is continuously detected that the loop current $i_{cb}$ flowing in the DC side of the active crowbar circuit 116 is larger than a predetermined current value $I_{cb0}$ within a predetermined time period, it is determined that the active crowbar circuit 116 can turn on normally. Otherwise, the controller 102 will shut down the doubly-fed induction generator system 100 and report to the system that the active crowbar circuit 116 is malfunctioned as the IGBT switch $Q_{s1}$ can not turn on normally.

Next, at the time point $t_2$, the controller 102 drives the IGBT switch $Q_{s1}$ of the active crowbar circuit 116 to turn off. In the meantime, the loop current $i_{cb}$ flowing in the DC side of the active crowbar circuit 116 will be decayed to zero. If it is continuously detected that the loop current $i_{cb}$ flowing in the DC side of the active crowbar circuit 116 is smaller than the predetermined current value $I_{cb0}$ within the predetermined time period, it is determined that the active crowbar circuit 116 can turn off normally. Otherwise, the loop current $i_{cb}$ flowing in the DC side of the active crowbar circuit 116 will continue to decay exponentially as indicated by the dotted line of FIG. 4, and the controller 102 will shut down the doubly-fed induction generator system 100 and report to the system that the active crowbar circuit 116 is malfunctioned as the IGBT switch $Q_{s1}$ can not turn off normally. If the active crowbar circuit 116 can turn on and off normally, then the controller 102 drives the rotor-side converter 106 to turn on again at the time point $t_3$, so that the doubly-fed induction generator system 100 can output power to the grid $V_g$ and the generated power can be outputted to the grid $V_g$ through the power-outputting switches MCB-1, MCB-2, MCB3. In this manner, the power outputted from the doubly-fed induction generator system 100 to the grid $V_g$ can be regulated.

In conclusion, the invention provides a doubly-fed induction generator system capable of self-testing the active crowbar circuit of the doubly-fed induction generator system. The inventive doubly-fed induction generator system is able to allow the controller thereof to self-test the active crowbar circuit before the doubly-fed induction generator system outputs electric power to the grid. It is to be noted that the loop current flowing in the DC side of the active crowbar circuit will be detected in order to determine if the active crowbar circuit can be turned on and off normally during the self-test period of the active crowbar circuit, and the rotor-side converter and the active crowbar circuit will not turn on simultaneously. Therefore, the over-current problem occurred to the rotor-side converter can be avoided.

While the invention has been described in terms of what are presently considered to be the most practical and preferred embodiments, it is to be understood that the invention need not be restricted to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the invention which is defined by the appended claims.

What is claimed is:

1. A self-test method for an active crowbar circuit, wherein the active crowbar circuit is applied to a doubly-fed induction generator system having a rotor and a rotor-side converter, the method comprising the steps of:

driving the rotor-side converter to turn on to allow the rotor-side converter to control the current of the rotor so as to maintain a root-mean-square value of the current of the rotor at a predetermined minimum value;

driving the rotor-side converter to turn off and driving the active crowbar circuit to turn on;

determining if the active crowbar circuit can be turned on normally, wherein the current of the rotor is larger than a predetermined current value within a predetermined time period when the active crowbar circuit is turned on normally;

driving the active crowbar circuit to turn off; and determining if the active crowbar circuit can be turned off normally, wherein the current of the rotor is smaller than the predetermined current value within the predetermined time period when the active crowbar circuit is turned off normally.

2. The self-test method for an active crowbar circuit according to claim 1 wherein the doubly-fed induction generator system further includes a grid-side converter, and before the step of driving the rotor-side converter to turn on, the method further comprises the step of:

driving the grid-side converter to turn on to establish a DC bus voltage at an input end of the rotor-side converter.

3. The self-test method for an active crowbar circuit according to claim 1 wherein a timing of executing the step of driving the active crowbar circuit to turn off lags behind a timing of executing the step of driving the rotor-side converter to turn off and driving the active crowbar circuit to turn on by a predetermined time interval.

4. The self-test method for an active crowbar circuit according to claim 1 wherein the step of determining if the active crowbar circuit can be turned on normally includes the sub-steps of:

continuously detecting a loop current of the active crowbar circuit within a predetermined time period to determine if the loop current of the active crowbar circuit is larger than a predetermined current value;

if it is determined that the loop current of the active crowbar circuit is larger than the predetermined current value within the predetermined time period, it is determined that the active crowbar circuit can be turned on normally; and if it is determined that the loop current of the active crowbar circuit is smaller than or equal to the predetermined current value within the predetermined time period, it is determined that the active crowbar circuit can not be turned on normally and shutting down the doubly-fed induction generator system.

5. The self-test method for an active crowbar circuit according to claim 4 wherein the step of determining if the active crowbar circuit can be turned off normally includes the sub-steps of:

continuously detecting a loop current of the active crowbar circuit within the predetermined time period to determine if the loop current of the active crowbar circuit is smaller than the predetermined current value;

if it is determined that the loop current of the active crowbar circuit is smaller than the predetermined current value within the predetermined time period, it is determined that the active crowbar circuit can be turned off normally; and if it is determined that the loop current of the active crowbar circuit is larger than or equal to the predetermined current value within the predetermined time period, it is determined that the active crowbar circuit can not be turned off normally and shutting down the doubly-fed induction generator system.

6. The self-test method for an active crowbar circuit according to claim 1 further comprising the step of:

if it is determined that the active crowbar circuit can be turned on and off normally, driving the rotor-side converter to turn on again and driving the doubly-fed induction generator system to output power to a grid.

7. The self-test method for an active crowbar circuit according to claim 6 wherein a timing of executing the step of driving the rotor-side converter to turn on again and driving the doubly-fed induction generator system to output power to a grid lags behind a timing of executing the step of driving the active crowbar circuit to turn off by a predetermined time interval.

* * * * *